United States Patent [19]
Alvis et al.

[11] Patent Number: 5,935,867
[45] Date of Patent: Aug. 10, 1999

[54] SHALLOW DRAIN EXTENSION FORMATION BY ANGLED IMPLANTATION

[75] Inventors: Roger Alvis, Cupertino; Scott Luning; Peter Griffin, both of Menlo Park, all of Calif.

[73] Assignee: Advanced Micro Devices, Inc., Sunnyvale, Calif.

[21] Appl. No.: 08/481,895

[22] Filed: Jun. 7, 1995

[51] Int. Cl.[6] .................................................. H01L 21/265
[52] U.S. Cl. ........................ 437/35; 437/34; 437/44; 437/56
[58] Field of Search .................. 437/44, 35, 34, 437/56

[56] References Cited

U.S. PATENT DOCUMENTS

| | | | |
|---|---|---|---|
| 4,232,439 | 11/1980 | Shibata | 437/44 |
| 4,282,648 | 8/1981 | Yu et al. | 29/571 |
| 4,366,613 | 1/1983 | Ogura et al. | 29/571 |
| 4,590,663 | 5/1986 | Haken | 29/571 |
| 5,217,910 | 6/1993 | Shimizu et al. | 437/44 |
| 5,223,445 | 6/1993 | Fuse | 437/44 |
| 5,257,095 | 10/1993 | Liu et al. | 257/315 |
| 5,258,319 | 11/1993 | Inuishi et al. | 437/44 |
| 5,270,226 | 12/1993 | Hori et al. | 437/44 |
| 5,286,655 | 2/1994 | Muragishi et al. | 437/44 |
| 5,292,674 | 3/1994 | Odake et al. | 437/44 |
| 5,413,945 | 5/1995 | Chien et al. | 437/44 |
| 5,413,946 | 5/1995 | Hong | 437/44 |
| 5,498,556 | 3/1996 | Hong et al. | 437/44 |
| 5,500,379 | 3/1996 | Odake et al. | 437/44 |
| 5,510,280 | 4/1996 | Noda | 437/44 |
| 5,527,725 | 6/1996 | Park | 437/44 |
| 5,532,176 | 7/1996 | Katada et al. | 437/44 |

FOREIGN PATENT DOCUMENTS

| | | | |
|---|---|---|---|
| 0093279 | 6/1983 | Japan | 437/44 |
| 0094635 | 4/1990 | Japan | 437/44 |
| 0292833 | 12/1990 | Japan | 437/44 |
| 404144237 | 5/1992 | Japan | 437/44 |

OTHER PUBLICATIONS

Ogura, et al., "Design and Characteristics of the Lightly Doped Drain–Source (LDD) Insulated Gate Field–Effect Transistor," IEEE Journal of Solid State Circuits, vol. SC–15 (1980), pp. 424–432.

*Primary Examiner*—John Niebling
*Assistant Examiner*—Long Pham
*Attorney, Agent, or Firm*—Fliesler, Dubb, Meyer & Lovejoy LLP

[57] ABSTRACT

A process for forming a shallow, lightly doped region in a semiconductor device. The method comprises the steps of providing a semiconductor substrate having a surface; growing an oxide layer on the substrate, the oxide having a thickness; depositing a layer of polysilicon on the oxide; patterning the polysilicon layer and the oxide layer to provide a gate structure; and implanting into the substrate a source and a drain region about the gate structure at an angle less than 90 degrees with respect to the surface of the substrate.

31 Claims, 4 Drawing Sheets

SHALLOW DRAIN EXTENSION FORMATION BY ANGLED IMPLANTATION

BACKGROUND OF THE INVENTION

1. Field of the Invention

The invention relates to a process for forming shallow drain extension regions in semiconductor devices.

2. Description of the Related Art

There is a continuing quest to define and produce transistors having ever-smaller overall cell geometries and that are capable of operating at increasing switching speeds. For the purposes of this application, cell geometry is defined as the two-dimensional surface area required for implementing a single, integral active logic element, typically an N- or P-channel transistor resistor or a pair of complementary transistors. Cell geometry can be distinguished from transistor geometry in that the latter refers to the three-dimensional structure of a single integral logic element.

A great deal of time and effort has been spent on producing the so-called LIGHTLY DOPED DRAIN-SOURCE (LDD) semiconductor device, wherein shallow extension regions are provided near the edges of the gate structure at the point within the transistor where a large degree of electric field strength occurs. Typically, these extension regions are provided adjacent to the source or drain (referred to collectively herein as the "active" regions) in a typical semiconductor device. (For purposes of this disclosure, the term "active region" is defined as any surface conductive region in a typical semiconductor device where a connection is made to elements external to the device such as, for example, a source or drain in an MOS device.) The typical LDD structure involves providing narrow, self-aligned lightly-doped regions between the device channel and more heavily doped source-drain diffusions in the device. It has been repeatedly shown that significant improvement in breakdown voltages, hot electron effects, and short channel threshold effects can be achieved using LDD regions, thereby allowing transistor operation at higher voltages and shorter channel lengths. Indeed, LDD technology is extremely advantageous in sub-micron channel length devices.

Typically, the lightly-doped drain region is extremely shallow so as to minimally impact all other electrical characteristics of the drain-to-channel interface and to maximize the corresponding reduction of the electric field strength within the lightly-doped drain region. This reduction in field strength directly reduces the transfer of energy to charge carriers at the oxide/substrate interface with the corresponding reduction in the number of charge carriers injected into the gate oxide.

Typical devices constructed with LDD regions are shown in Ogura, et al. titled "Design and Characteristics of the Lightly Doped Drain-Source (LDD) Insulated Gate Field-Effect Transistor", IEEE publication, copyright 1980, and U.S. Pat. Nos. 5,257,095, 4,590,663, 4,282,648, and 4,366,613.

In general, the LDD structure can be fabricated using conventional planar silicon-gate processing techniques and optical lithography. One such conventional process for forming LDD regions is shown in FIGS. 1–3. In FIG. 1, the P type silicon substrate 20 is first covered with a thermally grown silicon dioxide layer 22. Polysilicon layer 24 is next deposited onto the oxide layer 22, and the oxide layer and polysilicon layer 24 etched using any conventional photo-lithographic etching techniques to form a gate structure 26.

A light implantation of n- type dopants 28 may thereafter be provided to form a shallow, lightly doped region 30. As shown in FIG. 1, the gate structure 26 will block implantation of the n-ions below the gate region and the remaining portion of oxide layer 22.

As shown in FIG. 2, spacer regions 32 are formed by depositing a photoresist material or oxide over the surface of the gate structure 26 and the shallow n-region 30, followed by chemical etching. As shown in FIG. 3, a subsequent deep n+ implant is utilized to form the deep active regions 34 in P substrate 20.

While the prior art method for implementing the LDD regions in semiconductor devices has proved useful, improved methods are constantly being sought for reducing the production time of devices, increasing the accuracy of the implant dosage, and reducing the number of process steps required to manufacture such devices.

SUMMARY OF THE INVENTION

It is therefore an object of the invention to provide an improved process for manufacturing shallow doped impurity regions adjacent active regions in semiconductor devices.

It is a further object of the invention to provide a method which reduces the number of steps required to implement shallow doped extension regions in semiconductor devices.

These and other objects of the invention are provided in a process for forming a shallow doped region in a semiconductor device. The device includes active regions, such as a source and a drain region provided in a semiconductor substrate, and the shallow doped region may comprise a lightly doped drain region. The method comprises the steps of providing a semiconductor substrate having a surface; growing an oxide layer on the substrate, the oxide having a thickness; depositing a layer of polysilicon on the oxide; patterning the polysilicon layer and the oxide layer to provide a gate structure; and implanting into the substrate a source and a drain region about the gate structure at an angle greater than 0 degrees with respect to the surface normal to the substrate.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

The invention comprises a unique method for providing lightly doped drain regions in semiconductor devices utilizing angled dopant implantation to form both the lightly doped extension regions and the deeper implanted active regions of a first impurity type in a semiconductor device of a second impurity type.

The angled implantation of dopants results in a structure which modeling using conventional computer model simulations do not predict.

Figure 1:
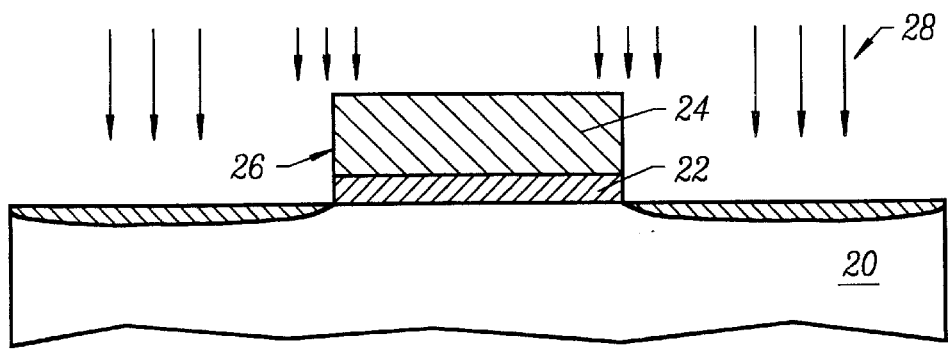
FIGS. 1–3 represent one prior art process utilized in forming lightly doped extension regions on a semiconductor device.
Figure 2:
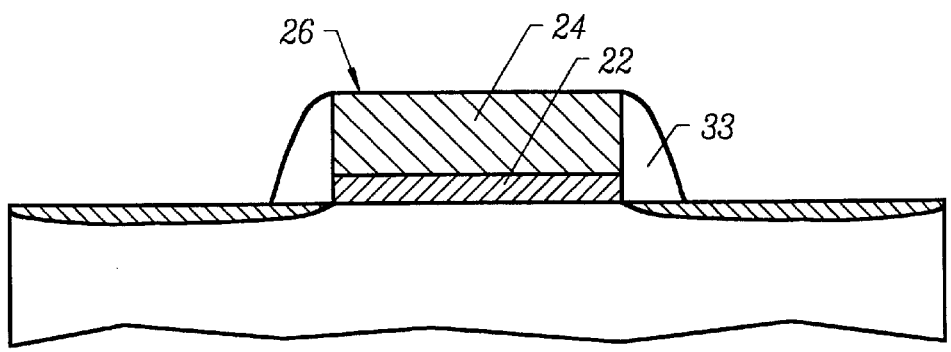
Figure 3:
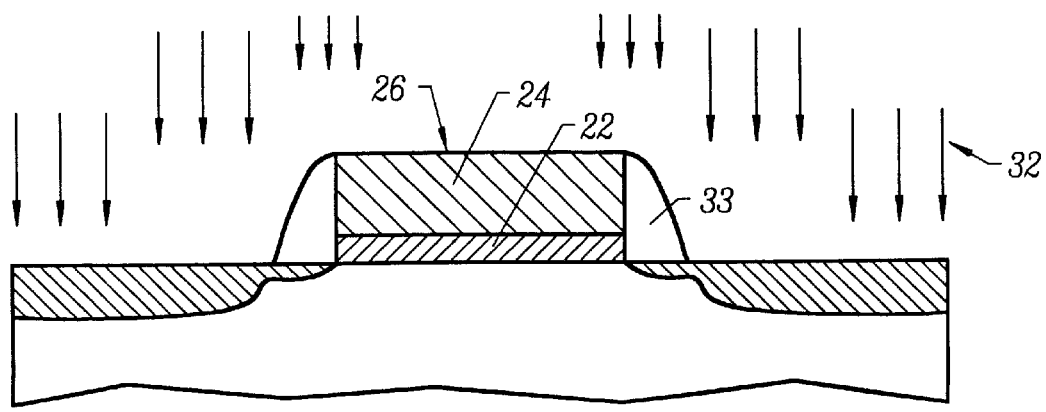
Figure 4:
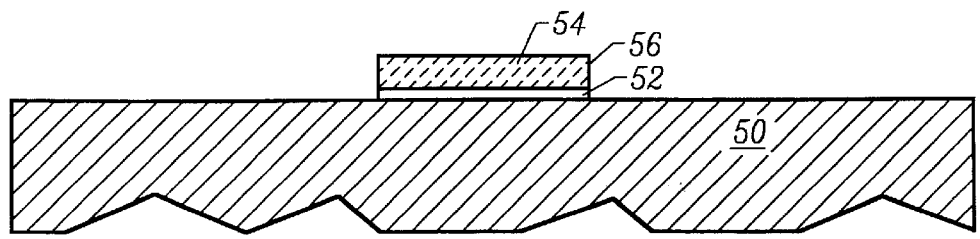
FIGS. 4–5 depict formation of lightly doped drain regions in accordance with the process of the present invention.
Figure 5:
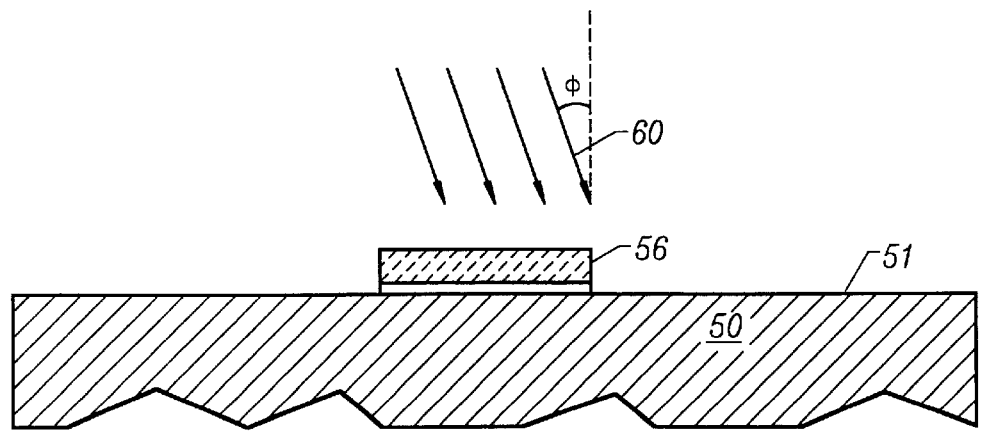

FIGS. 4 and 5 illustrate one exemplary process sequence of the present invention. The exemplary process will be illustrated in the context of a npn transistor. It should, however, be understood that the invention is suitable for many different technologies, including technologies other than those which are silicon based. In the exemplary process, a p-type substrate 50 is provided. A layer of silicon dioxide ($SiO_2$) 52 thermally grown is grown on substrate 50 to a height of approximately 200 Å. As will be recognized by one of average skill in the art, this oxide layer may have a thickness ranging from 50 Å to 500 Å. As should be further recognized by one of average skill, the dimensions provided herein are exemplary, and each of the specific dimensions of various thicknesses, energies and direction may be varied according to the invention.

A polysilicon layer 54 is deposited on oxide layer 52. In the process, a p-channel transistor is to be formed and this is a suitable gate of silicon material. However, it should be understood that any suitable gate material may be utilized.

As shown in FIG. 4, the structure is then patterned using conventional photolithography and etching techniques to provide the gate structure 56 shown in FIG. 4.

FIG. 5 shows the implantation step utilized in accordance with the present invention to form deeply implanted active regions and shallow extension regions adjacent to and aligned with gate structure 56. An n-type dopant, such as Arsenic, is represented by arrow 60. A key feature of the instant invention is that the implantation is made so that the dopant ions impinge the target at an angle which is not normal relative to the surface 51 of substrate 50. As shown in FIG. 5, the implantation is made at an angle ø which, measured from a line perpendicular to surface 51, is, in one embodiment of the invention, approximately 20°. The dopant may be implanted at any energy in a range of 35–120 keV with a dose of $1 \times 10^{15}$ ions/cm$^2$. The energy and dose are exemplary; the invention is suitable for use at any range of energies and concentrations.

Figure 6:
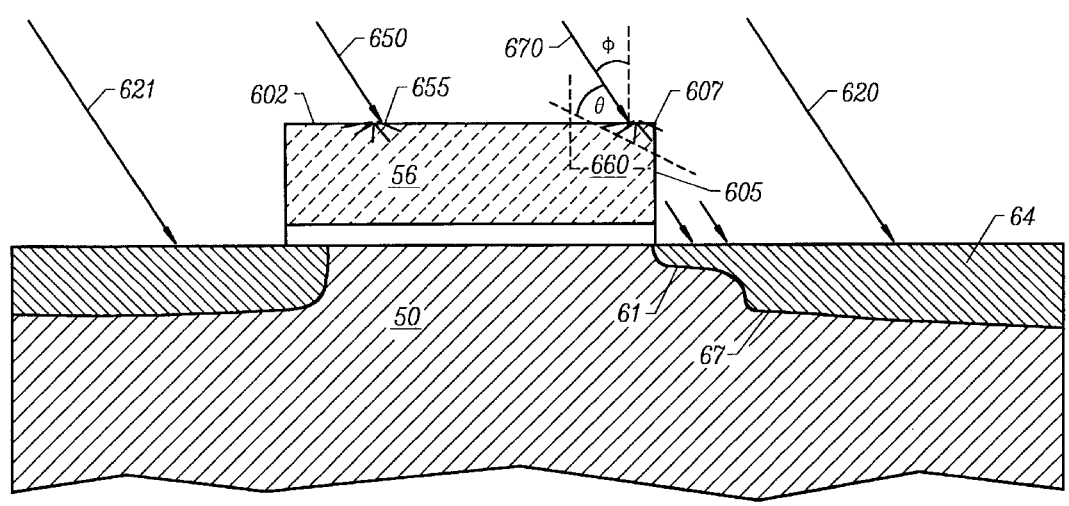
FIG. 6 is an enlarged view of the implantation process utilized in accordance with the present invention to form lightly doped drain regions.

FIG. 6 is a detailed view of the implant impinging on gate 56 and substrate in which the shallow drain extension 61 is to be formed. The gate structure serves as a masking element for the angled ion implantation beam and is defined by the top surface 602 and the side surface 605, the so-called "gate edge." Three areas of the ion implantation beam 620, 650, and 670, may be identified by the type of interaction of the ion beam with the gate mask.

The first area of the beam is the portion of the beam 620 sufficiently removed from the corner of the mask 607 which has no interaction with the mask. This portion of the beam implants into the substrate 50 with incident energy $E_0$, to form the deeply implanted "drain" portion 64 of the active region. The remaining two areas of the ion beam fall on the top of the gate mask and interact with the mask in such a way that each ion may be scattered into a direction described by a solid angular spread 655 of approximately π radians (180°).

There exists a distance 660 from the gate edge, approximated by the incident energy dependent projected range R, of the implanted species (Rcos[ø]), beyond which the scattering of ion beam 650 results in a complete containment of the ions within the confines of the gate mask. The third area of the ion beam is that which impinges on the gate mask within the boundaries defined by projected range 660 and the gate edge 605.

The portion of the ion beam 670 falling upon this defined area on the top of the gate may be scattered in such a way that a measurable number of ion will penetrate completely through the mask, emerging from the side of the mask 605 with less than the incident energy but with sufficient energy ($E_0$–E) and angular spread to implant the "shadowed" region. Thus formed in a single step is the spacerless, "self-aligned," shallow drain extension 61 and active region drain 64.

In the implanted substrate, an amorphization of the crystalline silicon occurs when the implanted species dose is greater than $1 \times 10^{15}$cm$^2$. Subsequent rapid thermal anneal (RTA) processing may result in transient enhanced diffusion (TED) effects. The net effect on the device of TED is the placement of the As-implanted doping contours indicated by solid lines 67.

However, the subsequent dopant activation process, whether through rapid thermal annealing or conventional furnace annealing, is incidental to the final structure of the device (within reason).

The non-masked angled implant 621 proceeds into the substrate uninhibited on the opposing side 65 of the gate structure. It is noteworthy that the "non-shadowed" side of the gate structure has a deeper implant region extending under the gate structure.

Figure 7:
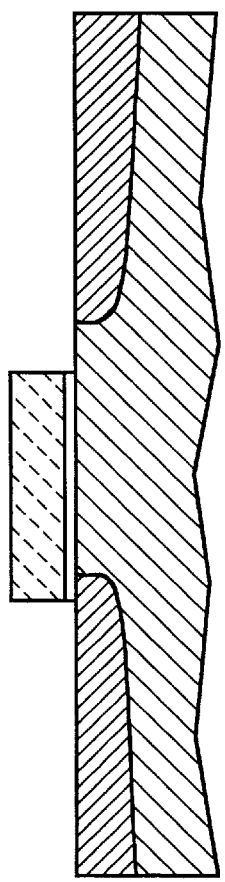
FIG. 7 is a cross-section of a structure which is predicted by computer modeling using, as input, the method of the present invention.

FIG. 7 represents the structure that conventional modeling software predicts will result from the implantation step discussed above. SUPREME 4 software simulations predict that, rather than the structure shown in FIG. 6, a shift in the drain region will occur, leaving some negative overlap (no overlap with the gate at all), while the source region, for example, will be pushed farther under the gate. Thus, the method of the present invention provides unexpected results which are contrary to the teachings of accepted methods of computer simulations.

Experimental results have shown that a 35 keV implant of Arsenic at 0–20° with the aforementioned thickness of the gate oxide 52 and polysilicon gate 54 results in a single doping contour appearing which is shallower near the gate edge. This agrees with the transient enhanced diffusion prediction that TED is proportional to the implantation energy, i.e. enhanced diffusion decreases as the implantation energy decreases and vice-versa. Thus, in the 35 keV implant situation, the part of the profile that is originally deeper does not move laterally as far as in the 120 keV case, does not make it to the gate edge, and leaves the shallow profile in the near-gate part of the shadow.

One-dimensional arsenic concentration depth profiles were obtained from unmasked regions of the samples with Perkin-Elmer phi 6600 SIMS system operated with a 5 keV, 200 nA Cs+ primary ion beam. In order to delineate the doped regions, specimens that had been prepared for AFM examination were given an additional etch for 15 seconds in a 21° C. mixture of 20 parts 70% $HNO_3$ and 1 part 49% HF. Reportedly, this "20:1" mixture etches silicon at a rate that is dependent on doping concentration, with an arsenic detection limit of approximately $10^{17}$cm$^3$. See, J. Liu, et al., *Proceedings of the Second International Workshop on the Measurement and Characterization of Ultra Shallow Doping Profiles in Semiconductors,* Vol. II, 1993, pp. 217–277, published by MCNC, Research Triangle Park, N.C. AFM micrographs of the etched junctions were acquired on a Veeco DekTak SXM atomic force microscope. A separate, high magnification TEM micrograph was used to accurately measure the thickness of the gate oxide for subsequent metrology. Process simulation of these structures was performed on Athena v.2.0.13, a commercial derivative of SUPREM-4, made by Silvaco International, Santa Clara, Calif.

Figure 8:
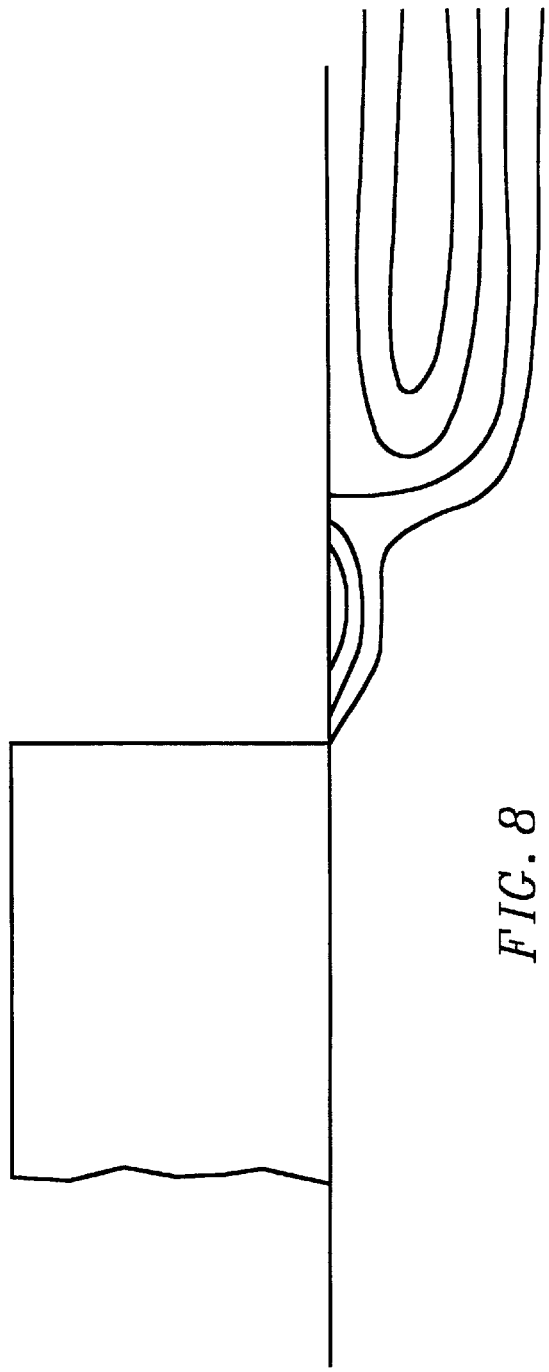
FIG. 8 is a representation of a cross-sectional atomic force microscopy analysis of the dopant levels in a semiconductor structure after processing in accordance with the invention.

FIG. 8 schematically shows Arsenic implanted doping profile contours which result from the method of the present invention. As shown therein, the shallow region 64 has an appearance quite similar to the LDD regions which are found in the prior art. It is noteworthy, however, that the region may not be "lightly doped" but may have the same concentration as the deep region.

Figure 9:
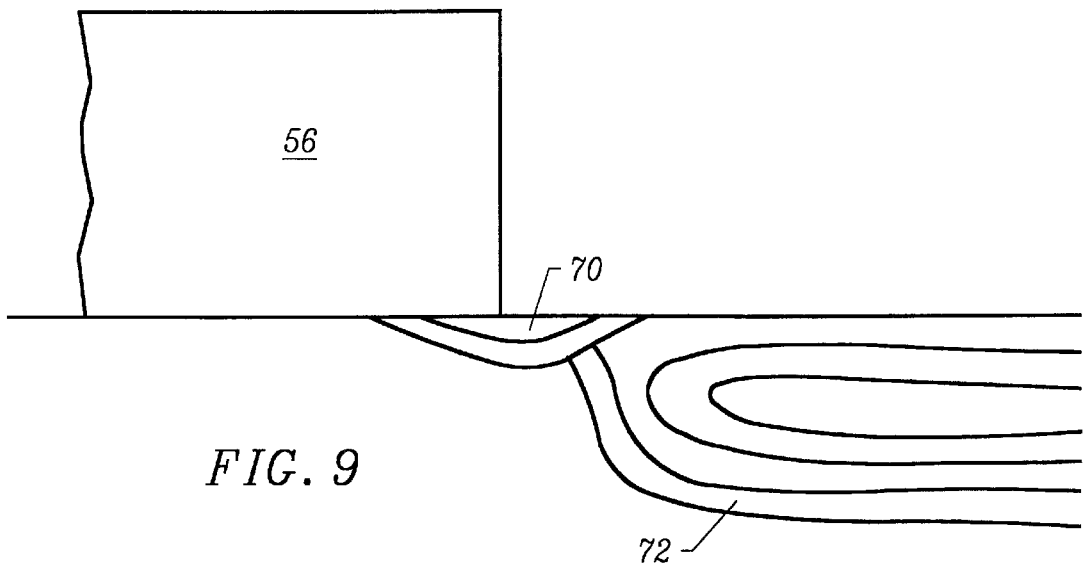
FIG. 9 is a representation of a cross-sectional atomic force microscopy analysis of the structure of FIG. 9 after a rapid thermal anneal.

FIG. 9 shows the actual doping profiles found after a rapid thermal anneal (RTA) is performed by exposing the structure to a temperature of 1,000° Celsius for a period of ten to thirty seconds. As shown therein, the doping contours spread laterally toward the gate region because of post implant diffusion. The deeper profile, represented at line 72 in FIG. 10, moves laterally toward the edge of the gate and encompasses the shallow profile region 70.

Normally implanted samples were characterized by detection-limit junction depths ($X_j$) of 925 Å and 1875 Å, 35 keV and 120 keV, respectively. Furthermore, the two-dimensional aspect of those same junctions is characterized by gate underlaps ($Y_j$) of 475 Å and 525 Å, respectively. Table 1 summarizes the results of $X_j$ and $Y_j$ measurements from each of the four samples, including both the shadowed and incident sides of the angle-implanted samples.

TABLE 1

Comparison of Characterized and Simulated Junction Parameters

| Sample | Implant Alignment | $X_j$ Measured | $X_j$ Simulated | $Y_j$ Measured | $Y_j$ Simulated |
|---|---|---|---|---|---|
| 35–0 | normal | 925Å | 925 | 475Å | 450 |
| 35–20 | shadowed | 875Å | 895 | −600Å | −730 |
|  | incident | 900Å | 900 | 750Å | 600 |
| 120–0 | normal | 1875Å | 1900 | 525Å | 600 |
| 120–20 | shadowed | 1875Å | 1850 | 75Å | −250 |
|  | incident | 1875Å | 1850 | 1700Å | 1075 |

As will be readily recognized by one of average skill in the art, the profile region shown in FIG. 9 could be a useful structure. Alternatives to providing the structure of a profile shown in FIG. 9 would be to alter the implantation angle dependent on the height of the gate, the length of the gate, and the desired resulting shallow doped LDD region extension to be formed. The as-implanted profile, shown in FIG. 9, can be thus engineered to provide desired device characteristics. A side benefit to increasing the angle would increase the "shadow" region cast by the gate and reduce the impact of the rapid thermal anneal. Alternatively, one could manipulate the implant/anneal combination to reduce the transient enhanced diffusion distance.

Thus, the present invention comprises using a combination of implant dosage, implant energy, and implantation angle, selected so that all or part of a source drain implant penetrates the corner of a formed gate structure and reaches a "shadowed" part of the substrate with a lower energy than the main implantation beam to provide shallow and/or regions lightly doped regions before or after a rapid thermal annealing process.

As should be further readily understood, a second implantation step, at a mirror symmetric angle to that of the first implantation of n-type dopants, can be used to provide LDD regions on the opposing side of the gate structure. For example, a mask could be provided over one half of the structure so that implantation on a first side of the gate structure would proceed in accordance with the invention. The mask is thus removed and a mark applied over the implanted area so that the second side of the device may be implanted.

The many features and advantages of the present invention would be obvious to one of average skill in the art. For example, the particular angle necessary for implantation could be anywhere in a range less than 90° perpendicular to the surface of the substrate, depending on the height of the gate, the implantation energy, and the thermal anneal desired after implantation. One of average skill in the art would be readily competent to, through use of empirical or computational results, determine the optimum angle, implantation energy, and annealing parameters to implement the scope of the present invention.

All such features and advantages are intended to be within the scope of the application as defined by the instant written description, the drawings, and the following claims.

What is claimed is:

1. A spacerless shallow implant process, comprising the steps of:

providing a substrate having a surface;

forming a mask structure on the surface of the substrate, the mask structure comprising a part of a semiconductor device;

implanting a dopant into the substrate at an angle of incidence such that a first portion of the dopant impinges the surface of the substrate at a first energy, while a second portion of the dopant impinges the mask structure and a fraction of the second portion enters the substrate adjacent to the mask structure at a second, lower implant energy without rotating the substrate.

2. The process of claim 1 wherein said step of forming a mask structure comprises forming a gate structure on the surface.

3. The process of claim 1 wherein said step of implanting comprises:

implanting an impurity in a direction such that the angle of incidence of the impurity is not perpendicular to the surface of the substrate, said angle being defined to induce a portion of the implant to impinge the surface of the substrate at the first implant energy, and a second portion of the implant to impinge the gate structure, pass through a portion of the gate structure, and impinge the surface of the substrate at the second, lower energy.

4. The process of claim 1 wherein said step of forming a mask structure comprises:

forming an insulating layer on the substrate, the insulating layer having a thickness;

depositing a conducting layer on the insulating layer; and patterning the conducting layer and the insulating layer to provide a gate structure.

5. The process of claim 1 wherein said angle is in a range of about 20°–45°.

6. The process of claim 1 wherein said angle is about 0°–89°, non-normal to the substrate.

7. The process of claim 1 further including the step, subsequent to said implanting step, of annealing the substrate at a temperature of 1,000° Centigrade for a period of about 10 to 30 seconds.

8. The process of claim 1 wherein said dopant is implanted at an energy and range of about 30 to 120 keV.

9. A process for forming a shallow doped drain region in a semiconductor device having a source and drain region provided in a semiconductor substrate, comprising:

providing a semiconductor substrate having a surface;

forming an insulating layer on the substrate, the insulating layer having a thickness;

depositing a conducting layer on the insulating layer;

patterning the conducting layer and the insulating layer to provide a gate structure; and implanting an impurity into the substrate about the gate structure at an angle less than 90 degrees with respect to the surface of the substrate without rotating the substrate thereby forming an LDD region of a first concentration of said impurity and a drain region of a second concentration of said impurity.

10. The process of claim 9 wherein the insulating layer has a thickness in the range of about 200 Å.

11. The process of claim 9 wherein the insulating layer comprises silicon dioxide.

12. The process of claim 11 wherein said step of forming comprises growing the silicon dioxide layer on the substrate.

13. The process of claim 11 wherein said step of forming comprises depositing the silicon dioxide layer on the substrate.

14. The process of claim 9 wherein the conducting layer comprises polysilicon.

15. The process of claim 9 wherein the conducting layer has a thickness of about 2000 Å.

16. The process of claim 9 wherein said step of patterning comprises depositing a layer of photoresistant material, exposing said layer of photoresistant material to incident radiation, and etching said layer of photoresist material and said polysilicon layer and stripping said photoresist material.

17. The process of claim 9 wherein said angle is in a range of about 20°.

18. The process of claim 9 wherein said angle is about 70°.

19. The process of claim 9 further including the step, subsequent to said implanting step, of annealing the substrate at a temperature of 1,000° Centigrade for a period of about 10 to 30 seconds.

20. The process of claim 9 wherein said implanting step comprises implanting Arsenic.

21. The process of claim 20 wherein said Arsenic is implanted at an energy and range of about 30 to 120 keV.

22. The process of claim 9 wherein said implanting step comprises implanting phosphorous.

23. The process of claim 9 wherein said implanting step comprises implanting boron.

24. A process for forming a shallow doped region adjacent to an active region in a semiconductor device, comprising:

providing a semiconductor substrate having a surface;

forming an oxide layer on the substrate, the oxide having a thickness;

depositing a layer of polysilicon on the oxide;

patterning the polysilicon layer and the oxide layer to provide a gate structure;

implanting an impurity into the substrate about the gate structure at an angle less than 90 degrees with respect to the surface of the substrate without rotating the substrate thereby forming an LDD region of a first concentration of said impurity and a drain region of a second concentration of said impurity.

25. The process of claim 24 wherein the oxide layer has a thickness in the range of about 200 Å.

26. The process of claim 24 wherein said step of forming comprises growing the silicon dioxide layer on the substrate.

27. The process of claim 24 wherein said step of forming comprises depositing the silicon dioxide layer on the substrate.

28. The process of claim 24 wherein the polysilicon layer has a thickness of about 2000 Å.

29. The process of claim 24 wherein said angle is in a range of about 20° to 45°.

30. The process of claim 24 wherein said angle is about 0°–89°, non-normal to substrate.

31. The process of claim 24 further including the step, subsequent to said implanting step, of annealing the substrate at a temperature of 1,000° Centigrade for a period of about 10 to 30 seconds.

* * * * *